(12) United States Patent
Zhang et al.

(10) Patent No.: US 11,762,290 B2
(45) Date of Patent: Sep. 19, 2023

(54) PHOTORESIST COMPOSITION, METHOD FOR PREPARING THE SAME, AND PATTERNING METHOD

(71) Applicant: Beijing Asahi Electronic Materials Co., Ltd, Beijing (CN)

(72) Inventors: Teng Zhang, Beijing (CN); Kejun Lu, Beijing (CN); Daeyoun Park, Beijing (CN); Fanhua Hu, Beijing (CN)

(73) Assignee: Beijing Asahi Electronic Materials Co., Ltd, Beijing (CN)

( * ) Notice: Subject to any disclaimer, the term of this patent is extended or adjusted under 35 U.S.C. 154(b) by 341 days.

(21) Appl. No.: 16/940,615

(22) Filed: Jul. 28, 2020

(65) Prior Publication Data
US 2021/0096463 A1    Apr. 1, 2021

(30) Foreign Application Priority Data
Sep. 29, 2019  (CN) .......................... 201910933465.5

(51) Int. Cl.
*G03F 7/023*    (2006.01)
*G03F 7/30*    (2006.01)
(Continued)

(52) U.S. Cl.
CPC .......... *G03F 7/0236* (2013.01); *G03F 7/0045* (2013.01); *G03F 7/0048* (2013.01);
(Continued)

(58) Field of Classification Search
CPC ........ G03F 7/0048; G03F 7/0045; G03F 7/11; G03F 7/023; G03F 7/022; G03F 7/004;
(Continued)

(56) References Cited

U.S. PATENT DOCUMENTS

| 6,007,961 A | * | 12/1999 | Inomata | ................. G03F 7/022 430/326 |
| 2009/0042127 A1 | * | 2/2009 | Park | ....................... G03F 7/038 430/281.1 |

(Continued)

FOREIGN PATENT DOCUMENTS

| CN | 101281369 A | 10/2008 |
| CN | 101561632 A | 10/2009 |

(Continued)

*Primary Examiner* — John S Chu
*Assistant Examiner* — Andrew Preston Traywick
(74) *Attorney, Agent, or Firm* — McCoy Russell LLP

(57) ABSTRACT

The present disclosure relates to a photoresist composition, a method for preparing the same, and a patterning method. The photoresist composition includes: 1 wt % to 10 wt % of a photosensitizer; 10 wt % to 20 wt % of a phenolic resin; 0.1 wt % to 5.5 wt % of an additive; and 75 wt % to 88 wt % of a solvent, based on the total weight of the photoresist composition, in which the photosensitizer includes: 20 wt % to 70 wt % of a first photosensitive compound represented by formula (1), 20 wt % to 70 wt % of a second photosensitive compound represented by formula (2), and 1 wt % to 35 wt % of a third photosensitive compound represented by formula (3), based on the total weight of the photosensitizer. The photoresist composition of the present disclosure simultaneously guarantees high resolution and high sensitivity, and can meet actual production requirements.

20 Claims, 1 Drawing Sheet

(a)      (b)      (c)      (d)

(51) Int. Cl.

| | | |
|---|---|---|
| *G03F 7/004* | (2006.01) | |
| *G03F 7/11* | (2006.01) | |
| *G03F 7/34* | (2006.01) | |
| *G03F 7/32* | (2006.01) | |
| *G03F 7/022* | (2006.01) | |
| *G03F 7/36* | (2006.01) | |
| *G03F 7/38* | (2006.01) | |
| *G03F 7/40* | (2006.01) | |

(52) U.S. Cl.
CPC .............. *G03F 7/0226* (2013.01); *G03F 7/11* (2013.01); *G03F 7/30* (2013.01); *G03F 7/32* (2013.01); *G03F 7/34* (2013.01); *G03F 7/36* (2013.01); *G03F 7/38* (2013.01); *G03F 7/40* (2013.01)

(58) Field of Classification Search
CPC .......... G03F 1/76; G03F 7/085; G03F 7/0236; G03F 7/0007; G03F 7/30; G03F 7/32; G03F 7/34; G03F 7/36; G03F 7/38; G03F 7/40; G03F 7/22
See application file for complete search history.

(56) References Cited

U.S. PATENT DOCUMENTS

2009/0258497 A1 10/2009 Park et al.
2017/0329221 A1* 11/2017 Imada .................... C08L 61/06

FOREIGN PATENT DOCUMENTS

| CN | 102786662 A | 11/2012 |
|---|---|---|
| CN | 104614942 A | 5/2015 |
| KR | 1019990041936 A | 6/1999 |
| TW | 201305727 A | 2/2013 |
| TW | I507818 B | 11/2015 |

* cited by examiner (a) (b) (c) (d)

(a) (b) (c) (d)

(a) (b) (c) (d)

PHOTORESIST COMPOSITION, METHOD FOR PREPARING THE SAME, AND PATTERNING METHOD

CROSS-REFERENCE TO RELATED APPLICATION

This application claims a priority to Chinese Patent Application No. 201910933465.5 filed on Sep. 29, 2019, the disclosures of which are incorporated in their entirety by reference herein.

TECHNICAL FIELD

The present disclosure relates to the field of photoresist, in particular, to a photoresist composition, a method for preparing the same, and a patterning method using the photoresist composition.

BACKGROUND

A photoresist is one of the important upstream materials for preparing the organic light emitting diode (OLED) panel, and is a composition for forming functional patterns. A photoresist is generally classified into a positive photoresist and a negative photoresist. The method for forming a pattern by using a positive photoresist includes: coating a photoresist layer on a substrate; exposing the photoresist to light through a mask; and forming a desired pattern on the substrate after developing with an alkaline solution. This is because the solubility of the photoresist in the alkaline solution will change after exposure, the solubility of the exposed part will increase, and the solubility of the unexposed part will decrease. Commonly used exposure light sources are G line (with a wavelength of 436 nm) and I line (with a wavelength of 365 nm). G line photoresist has the advantage of high sensitivity, but the resolution is relatively low; and I line photoresist has the advantage of high resolution, but the sensitivity is low.

With the wide application of flat panel displays in the field of multimedia, it is necessary to continuously improve the resolution of the panel. Therefore, there are higher requirements on the resolution of the existing photoresist. Moreover, in order to increase productivity, the photoresist is required to have high sensitivity. Therefore, it is necessary to develop a photoresist composition that can satisfy both high resolution and high sensitivity.

SUMMARY

In an aspect, an embodiment of the present disclosure provide a photoresist composition, including: 1 wt % to 10 wt % of a photosensitizer; 10 wt % to 20 wt % of a phenolic resin; 0.1 wt % to 5.5 wt % of an additive; and 75 wt % to 88 wt % of a solvent, based on the total weight of the photoresist composition, in which the photosensitizer includes: 20 wt % to 70 wt % of a first photosensitive compound represented by formula (1), 20 wt % to 70 wt % of a second photosensitive compound represented by formula (2), and 1 wt % to 35 wt % of a third photosensitive compound represented by formula (3), based on the total weight of the photosensitizer,

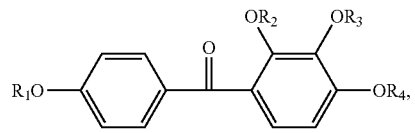

(1)

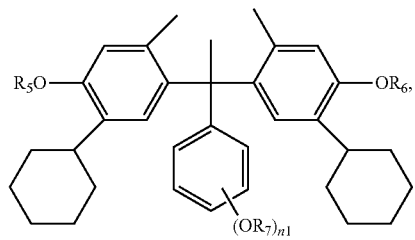

(2)

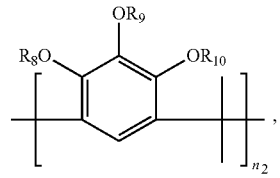

(3)

in which $R_1$, $R_2$, $R_3$ and $R_4$ are each independently selected from a group represented by a formula (4), a group represented by the formula (5), or hydrogen atom, and at least three of $R_1$, $R_2$, $R_3$ and $R_4$ are the group represented by formula (4) or formula (5);

in which $R_5$, $R_6$ and $R_7$ are each independently selected from the group represented by formula (4), the group represented by formula (5), or hydrogen atom, and at least one of $R_5$, $R_6$ and $R_7$ is the group represented by formula (4) or formula (5), and $n_1$ is 1 or 2;

in which $R_8$, $R_9$ and $R_{10}$ are each independently selected from the group represented by formula (4), the group represented by formula (5), or hydrogen atom, and at most one of $R_8$, $R_9$ and $R_{10}$ is the group represented by formula (4) or formula (5), the rest is hydrogen atom, and $n_2$ is an integer of 5 to 50;

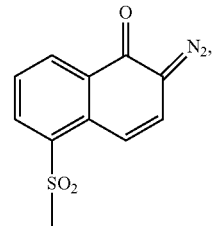

(4)

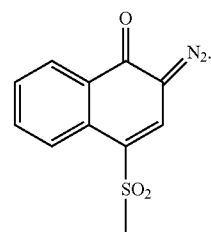

(5)

Optionally, the photosensitizer includes: 30 wt % to 50 wt % of the first photosensitive compound; 40 wt % to 50 wt % of the second photosensitive compound; and 10 wt % to 25 wt % of the third photosensitive compound, based on the total weight of the photosensitizer.

Optionally, in the compound represented by formula (3), $n_2$ is an integer of 10 to 25.

Optionally, a mass ratio of the first photosensitive compound to the second photosensitive compound is in a range from 3:7 to 7:3.

Optionally, a mass ratio of the second photosensitive compound to the third photosensitive compound is greater than 1:1.

Optionally, the additive includes a surfactant and an adhesion promoter.

Optionally, an amount of the surfactant is in a range from 0.1 wt % to 0.5 wt %; and the amount of the adhesion promoter is in a range from 1 wt % to 5 wt %.

Optionally, the surfactant is a silicone-based surfactant or a fluorocarbon compound; and the adhesion promoter is one or more selected from a group consisting of melamine resin, silane coupling agent and polyethylene based compound.

Optionally, the phenolic resin has a molecular weight in a range from 4000 to 8000.

In another aspect, an embodiment of the present disclosure provide a method for preparing a photoresist composition, including: mixing uniformly 1 wt % to 10 wt % of a photosensitizer; 10 wt % to 20 wt % of a phenolic resin; 0.1 wt % to 5.5 wt % of an additive and 75 wt % to 88 wt % of a solvent, based on the total weight of the photoresist composition, and dissolving the photosensitizer, the phenolic resin and the additive into the solvent to obtain a photoresist composition, in which the photosensitizer includes: 20 wt % to 70 wt % of a first photosensitive compound represented by formula (1), 20 wt % to 70 wt % of a second photosensitive compound represented by formula (2), and 1 wt % to 35 wt % of a third photosensitive compound represented by formula (3), based on the total weight of the photosensitizer;

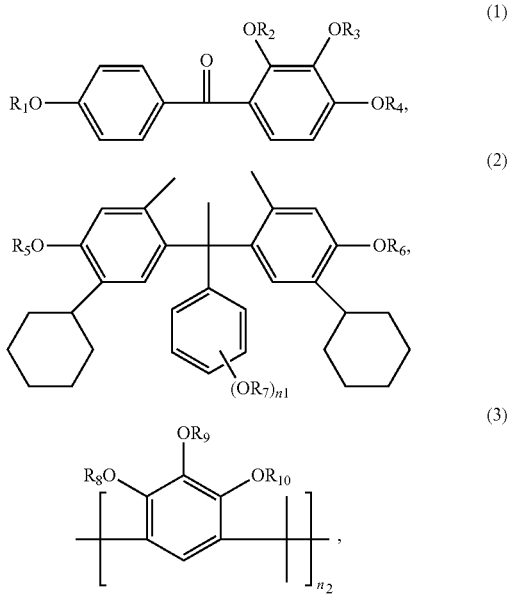

in which $R_1$, $R_2$, $R_3$ and $R_4$ are each independently selected from a group represented by a formula (4), a group represented by the formula (5), or hydrogen atom, and at least three of $R_1$, $R_2$, $R_3$ and $R_4$ are the group represented by formula (4) or formula (5);

in which $R_5$, $R_6$ and $R_7$ are each independently selected from the group represented by formula (4), the group represented by formula (5), or hydrogen atom, and at least one of $R_5$, $R_6$ and $R_7$ is the group represented by formula (4) or formula (5), and $n_1$ is 1 or 2;

in which $R_8$, $R_9$ and $R_{10}$ are each independently selected from the group represented by formula (4), the group represented by formula (5), or hydrogen atom, and at most one of $R_8$, $R_9$ and $R_{10}$ is the group represented by formula (4) or formula (5), the rest is hydrogen atom, and $n_2$ is an integer of 5 to 50;

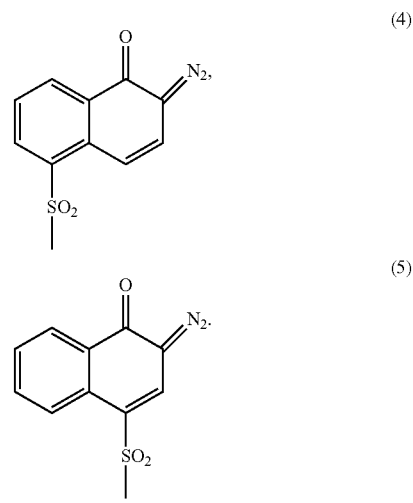

In a yet aspect, an embodiment of the present disclosure further provide a patterning method using the photoresist composition according to any one of the above embodiments, including: providing a base substrate; forming a functional material layer on the base substrate; coating the photoresist composition on the functional material layer to form a photoresist layer; exposing the photoresist layer to a mixed light source of H line, I line and G line through a mask; developing the exposed photoresist layer to form a photoresist pattern; and etching the functional material layer by using the photoresist pattern as a mask, to form a functional pattern.

DETAILED DESCRIPTION

Figure 1:
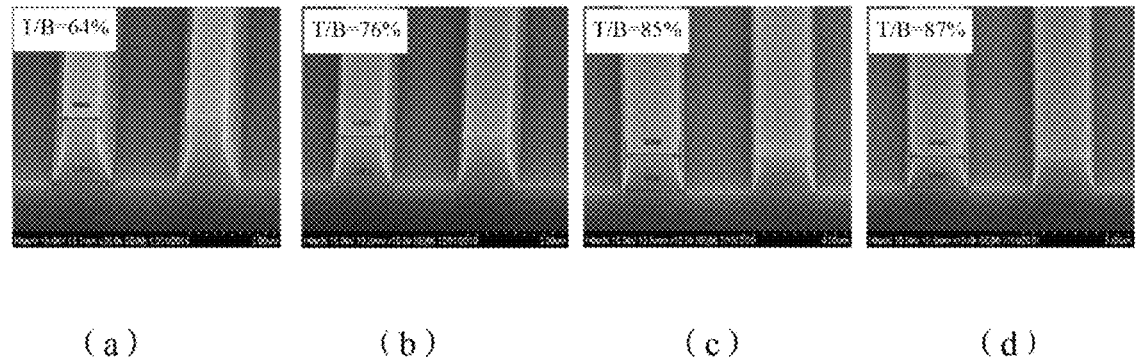
FIG. 1 is a graph of test results showing the resolution of the photoresist composition prepared according to an example of the present disclosure.

In order to better understand the present disclosure, the embodiments of the present disclosure will be described below in combination with Examples, but it should be understood that these descriptions are merely used to further illustrate the features and advantages of the present disclosure and are not intended to limit the present disclosure.

In the related art, many photoresist compositions for manufacturing display panels have been proposed. A photoresist composition is proposed as follows, which includes: salicylaldehyde novolak resin as an alkali-soluble resin; a diazonaphthoquinone compound (preferably diazonaphthoquinone trihydroxybenzophenone ester) as a photosensitizer. The pattern formed by using the photoresist composition exhibits heat resistance as high as 140° C. or more. The photoresist resin of the present invention can achieve the uniformity of the prepared pattern by satisfying the heat resistance, the photosensitivity and the uniformity of film thickness. However, the formed pattern has a line width of 3.0 µm or more, resulting in a resolution that cannot meet the requirements for high resolution. In addition, a polymer photosensitizer and a photoresist composition are also proposed, which has good sensitivity and film forming properties, but the optimal resolution is only 3.0 µm. In addition, a high heat-resistant film forming resin and its positive photoresist composition are also proposed. The better the heat resistance of the photoresist, the better the formation of the fine pattern. The high heat-resistant film forming resin is a linear phenolic resin modified with silicone, which can improve heat resistance and dry etching resistance. However, since only the G line photosensitive compound is used, the improvement in resolution is not significant.

In view of the technical problem in the related art, the present disclosure provides a photoresist composition and a method for preparing the same, and a patterning method using the photoresist composition. The photoresist composition has excellent sensitivity and resolution, and can be used in the preparation of high-performance OLED display devices.

An embodiment of the present disclosure provide a photoresist composition, including: 1 wt % to 10 wt % of a photosensitizer; 10 wt % to 20 wt % of a phenolic resin; 0.1 wt % to 5.5 wt % of an additive; and 75 wt % to 88 wt % of a solvent, based on the total weight of the photoresist composition, in which the photosensitizer includes: 20 wt % to 70 wt % of a first photosensitive compound represented by formula (1), 20 wt % to 70 wt % of a second photosensitive compound represented by formula (2), and 1 wt % to 35 wt % of a third photosensitive compound represented by formula (3), based on the total weight of the photosensitizer,

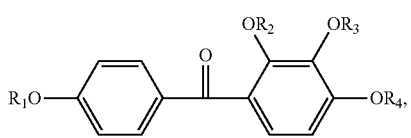
(1)

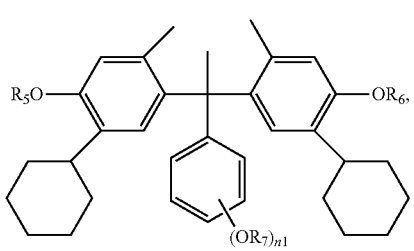
(2)

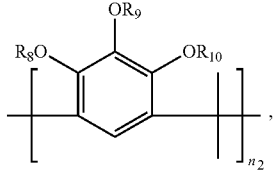
(3)

in which $R_1$, $R_2$, $R_3$ and $R_4$ are each independently selected from a group represented by a formula (4), a group represented by the formula (5), or hydrogen atom, and at least three of $R_1$, $R_2$, $R_3$ and $R_4$ are the group represented by formula (4) or formula (5);

in which $R_5$, $R_6$ and $R_7$ are each independently selected from the group represented by formula (4), the group represented by formula (5), or hydrogen atom, and at least one of $R_5$, $R_6$ and $R_7$ is the group represented by formula (4) or formula (5), and $n_1$ is 1 or 2;

in which $R_8$, $R_9$ and $R_{10}$ are each independently selected from the group represented by formula (4), the group represented by formula (5), or hydrogen atom, and at most one of $R_8$, $R_9$ and $R_{10}$ is the group represented by formula (4) or formula (5), the rest is hydrogen atom, and $n_2$ is an integer of 5 to 50;

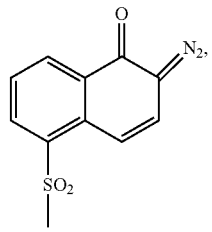
(4)

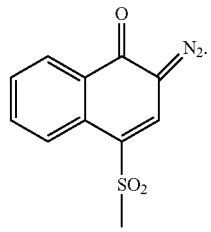
(5)

The photoresist composition of the embodiment of the present disclosure includes three photosensitizers. The first photosensitive compound has the advantage of high sensitivity; the second photosensitive compound is conducive to the formation of high-resolution patterns; and the third photosensitive compound has a high hydroxyl content after modification, which is conducive to improving the photosensitivity of the composition. The three photosensitive compounds cooperate with each other and act synergistically, ensure the high resolution and high sensitivity of the photoresist composition, and meet actual production requirements. After experimental tests, the resolution of the photoresist composition of the present disclosure is lower than 2.5 µm, and even the minimum resolution can reach 1.5 µm; meanwhile, the sensitivity is relatively fast, which is conducive to accurate patterning, thereby improving the production efficiency of the OLED display panel.

The photoresist composition according to an embodiment of the present disclosure is a positive photoresist composition, and the alkali solubility increases after exposure.

It should be noted that the content of each component in the photoresist composition of the present disclosure is the percentage content of the weight of each component relative to the total weight of the entire photoresist composition, so the sum of the percentage contents of the weight of each component in the photoresist composition is 100%; and the content of each photosensitizer in the present disclosure is the percentage content of the weight of each photosensitizer component relative to the total weight of all photosensitizer components, so the sum of the weight percentages of each photosensitizer component in the photosensitizer is 100%.

The first photosensitive compound represented by the formula (1) may be exposed to light having a wavelength of G line. Optionally, at least three of $R_1$, $R_2$, $R_3$, and $R_4$ are the group represented by formula (4), and the rest is hydrogen atom. Optionally, in the photosensitizer, the content of the first photosensitive compound is in a range from 20 wt % to 70 wt %. Optionally, the content of the first photosensitive compound is in a range from 30 wt % to 60 wt % or in a range from 30 wt % to 50 wt %. Further optionally, the content of the first photosensitive compound is in a range from 30 wt % to 40 wt %.

The second photosensitive compound represented by the formula (2) may be exposed to light having a wavelength of I line. Optionally, in formula (2), at least one of $R_5$, $R_6$ and $R_7$ is the group represented by formula (4), and m is 1. Optionally, the second photosensitive compound can be obtained by reacting a compound represented by formula (6) with 2-diazo-1-naphthol-5-sulfonyl chloride or 2-diazo-1-naphthol-4-sulfonyl chloride:

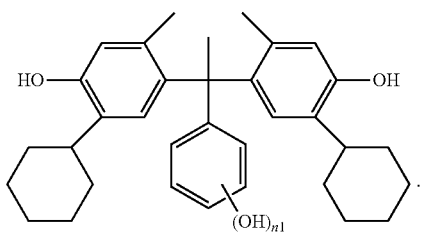

(6)

Optionally, in the photosensitizer, the content of the second photosensitive compound is in a range from 20 wt % to 70 wt %. Optionally, the content of the second photosensitive compound is in a range from 30 wt % to 60 wt % or in a range from 30 wt % to 50 wt %. Further optionally, the content of the second photosensitive compound is in a range from 40 wt % to 50 wt %.

The third photosensitive compound represented by the formula (3) is a photosensitive compound modified by a resin, and can be exposed to light having a wavelength of H line (with a wavelength of 405 nm). Optionally, in formula (3), at most one of $R_8$, $R_9$, and $R_{10}$ is the group represented by formula (4), and $n_2$ is an integer of 10 to 30. Optionally, the third photosensitive compound can be obtained by reacting a compound represented by formula (7) with 2-diazo-1-naphthol-5-sulfonyl chloride or 2-diazo-1-naphthol-4-sulfonyl chloride:

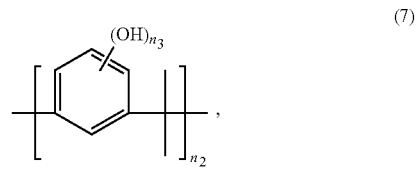

(7)

where $n_3$ is an integer from 1 to 4.

Optionally, in the photosensitizer, the content of the third photosensitive compound is in a range from 1 wt % to 35 wt %. Optionally, the content of the third photosensitive compound is in a range from 3 wt % to 30 wt % or in a range from 5 wt % to 28 wt %. Further optionally, the content of the third photosensitive compound is in a range from 10 wt % to 25 wt %, in a range from 8 wt % to 20 wt %, or in a range from 10 wt % to 18 wt %.

Optionally, in the compound represented by formula (3), $n_2$ is an integer of 10 to 25. Optionally, $n_2$ is an integer of 12 to 20, an integer of 13 to 18, or an integer of 14 to 16.

Optionally, the mass ratio of the first photosensitive compound to the second photosensitive compound is in a range from 3:7 to 7:3, and further optionally in a range from 4:6 to 6:4, for example 1:1. The use of mixed two photosensitive compounds can balance sensitivity and resolution.

Optionally, the mass ratio of the second photosensitive compound to the third photosensitive compound is greater than 1:1, and further optionally greater than 1.5:1, or even greater than 2:1.

Optionally, the mass ratio of the first photosensitive compound to the third photosensitive compound is in a range from 1:4 to 4:1, or even in a range from 7:3 to 4:1. The third photosensitive compound has a better sensitivity improvement effect than the first photosensitive compound, and accordingly has a greater adverse effect on resolution than the first photosensitive compound. Therefore, the adding an appropriate amount of the third photosensitive compound can further improve the sensitivity without affecting the resolution. At the same time, the third photosensitive compound has a high content of benzene ring, which is conducive to improve heat resistance. The first photosensitive compound, the second photosensitive compound and the third photosensitive compound involved in the present disclosure can all be synthesized by methods in prior art.

The phenolic resin in the photoresist composition according to an embodiment of the present disclosure may be a novolac resin. Optionally, the novolac resin is obtained by reacting a phenolic compound with an aldehyde compound in the presence of an acid catalyst. Optionally, the novolac resin has a molecular weight in a range from 4000 to 8000. The phenolic compound can be selected from a group consisting of o-cresol, m-cresol, p-cresol; xylenol, such as 2,3-xylenol, 2,4-xylenol, 2,5-xylenol, and 3,5-xylenol; and alkylphenol, such as 2,3,5-trimethylphenol, o-ethylphenol, m-ethylphenol, p-ethylphenol, 2,3,5-triethylphenol, o-tert-butylphenol, m-ethylphenol, p-tert-butylphenol, 2-tert-butyl-4-methylphenol, o-isopropylphenol, m-isopropylphenol, p-isopropylphenol, and 3-methyl-4-isopropylphenol. Optionally, the phenolic compound is alkoxyphenol, such as m-methoxyphenol, p-methoxyphenol, and o-methoxyphenol; and polyhydroxyphenol, m-cresol, p-cresol, 2,4-xylenol or 3,5-xylenol.

The aldehyde compound may be formaldehyde, acetaldehyde, propionaldehyde, benzaldehyde, phenylacetaldehyde, o-methylbenzaldehyde, m-methylbenzaldehyde, p-methylbenzaldehyde, o-hydroxybenzaldehyde, m-hydroxybenzaldehyde, p-hydroxybenzaldehyde, salicylaldehyde, etc. Optionally, the aldehyde compound is formaldehyde.

The phenolic resin can also be a phenolic resin generated by reacting the two or more of the phenolic compounds selected from the above with the aldehyde compound. For example, it is a phenolic resin generated by reacting two or more of phenolic compounds selected from m-cresol, p-cresol, 2,4-xylenol, 2,5-xylenol and 3,5-xylenol with formaldehyde.

The photoresist composition according to an embodiment of the present disclosure includes an additive. Optionally, the photoresist composition includes a surfactant and a adhesion promoter. Optionally, the addition amount of the surfactant is in a range from 0.1 wt % to 0.5 wt %, and the addition amount of the adhesion promoter is in a range from 1 wt % to 5 wt %.

Optionally, the surfactant is a silicone-based surfactant or a fluorocarbon compound, and further optionally a fluorocarbon compound. The addition of the surfactant is conducive to improve the uniformity of film thickness during slit coating.

Optionally, the adhesion promoter is one or more selected from a group consisting of melamine resin, silane coupling agent and polyethylene based compound.

In the photoresist composition according to the embodiment of the present disclosure, the solvent is required to have good solubility and good coating performance, and may be selected from propylene glycol methyl ether acetate, ethylene glycol monomethyl ether, propylene glycol monomethyl ether, diethylene glycol monomethyl ether, ethylene glycol dimethyl ether, ethyl lactate, ethyl acetate, n-butyl acetate, N-methylpyrrolidone, etc. Optionally, the solvent is propylene glycol methyl ether acetate.

The embodiment of the present disclosure also discloses a method for preparing a photoresist composition, including: mixing uniformly 1 wt % to 10 wt % of a photosensitizer, 10 wt % to 20 wt % of a phenolic resin, 0.1 wt % to 5.5 wt % of an additive and 75 wt % to 88 wt % of a solvent, based on the total weight of the photoresist composition, and dissolving the photosensitizer, the phenolic resin and the additive into the solvent to obtain a photoresist composition, in which the photosensitizer includes: 20 wt % to 70 wt % of a first photosensitive compound represented by formula (1), 20 wt % to 70 wt % of a second photosensitive compound represented by formula (2), and 1 wt % to 35 wt % of a third photosensitive compound represented by formula (3), based on the total weight of the photosensitizer,

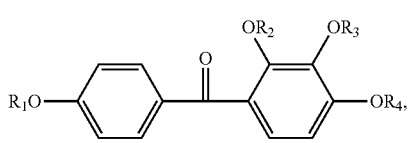

(1)

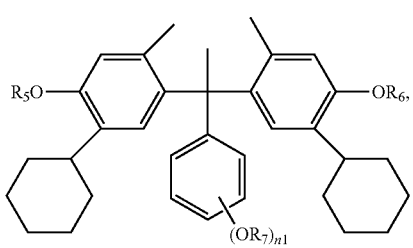

(2)

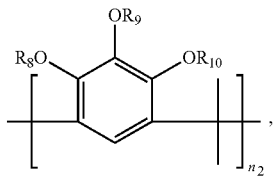

(3)

in which $R_1$, $R_2$, $R_3$ and $R_4$ are each independently selected from a group represented by a formula (4), a group represented by the formula (5), or hydrogen atom, and at least three of $R_1$, $R_2$, $R_3$ and $R_4$ are the group represented by formula (4) or formula (5);

in which $R_5$, $R_6$ and $R_7$ are each independently selected from the group represented by formula (4), the group represented by formula (5), or hydrogen atom, and at least one of $R_5$, $R_6$ and $R_7$ is the group represented by formula (4) or formula (5), and $n_1$ is 1 or 2;

in which $R_8$, $R_9$ and $R_{10}$ are each independently selected from the group represented by formula (4), the group represented by formula (5), or hydrogen atom, and at most one of $R_8$, $R_9$ and $R_{10}$ is the group represented by formula (4) or formula (5), the rest is hydrogen atom, and $n_2$ is an integer of 5 to 50;

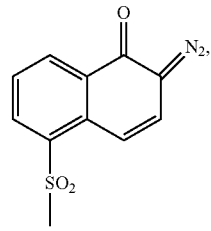

(4)

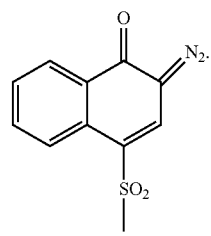

(5)

The components in the prepared photoresist composition are the same as the components in above technical solutions, and will not be repeated herein.

An embodiment of the present disclosure further discloses a patterning method using the photoresist composition according to any one of the above embodiments, including: providing a base substrate; forming a functional material layer on the base substrate; coating the photoresist composition on the functional material layer to form a photoresist layer; exposing the photoresist layer to a mixed light source of H line, I line and G line through a mask; developing the exposed photoresist layer to form a photoresist pattern; and etching the functional material layer by using the photoresist pattern as a mask, to form a functional pattern.

In the patterning method according to the embodiment of the present disclosure, first a functional material layer was formed on the substrate; then a photoresist layer was formed on the functional material layer; then a mask was used to shield the photoresist layer; and a mixed light source was used to expose the photoresist layer. The embodiment of the present disclosure may use mixed light having wavelengths of G line, H line, and I line, to expose the photoresist layer. After the exposure, the exposed photoresist layer was developed, to remove the exposed part with high solubility, and to remain the unexposed part having low solubility remains, to form a photoresist pattern. Finally, the photoresist pattern is used as a mask for etching the functional material layer, to form a functional pattern.

The photoresist composition according to the embodiment of the present disclosure has good sensitivity and resolution to light having wavelengths of G line, H line and I line. Optionally, the resolution of the photoresist composition of the embodiment of the present disclosure is lower than 2.5 μm, and the minimum resolution can reach 1.5 μm; meanwhile, the sensitivity is relatively fast, for example, the sensitivity can reach 70 mj or less. This performance is conducive to accurate patterning, thereby improves the yield of OLED display panel.

In order to further understand the technical solutions of the present disclosure, the photoresist composition and the method for preparing the same provided by the present disclosure will be described detailedly in the following Examples, but the protection scope of the present disclosure is not limited by the following Examples.

EXAMPLES

Examples 1 to 9

13 g of a phenol resin, 3 g of a photosensitizer, 0.5 g of a surfactant, 1.5 g of an adhesion promoter, and 82 g of a solvent were mixed, to obtain a photoresist composition. The above phenolic resin is made by the reaction of cresol, xylenol and formaldehyde, and has a molecular weight of 4000. The surfactant is a fluorocarbon compound. The adhesion promoter is melamine resin. The solvent is propylene glycol methyl ether acetate. The photosensitive agent includes a first photosensitive compound represented by formula (1), a second photosensitive compound represented by formula (2), and a third photosensitive compound represented by formula (3):

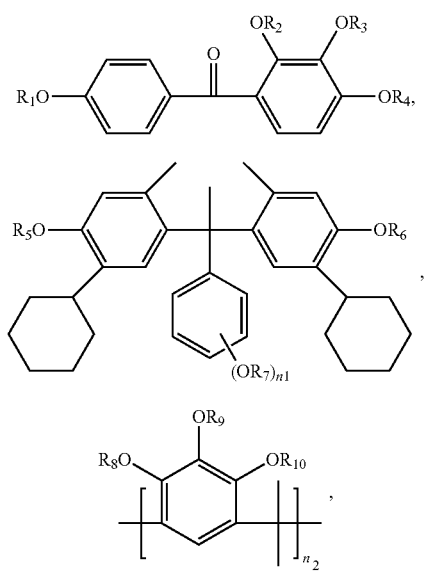

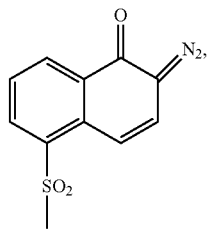

in which at least three of $R_1$, $R_2$, $R_3$, and $R_4$ are the compound represented by formula (4), and the rest is hydrogen atom; in which at least one of $R_5$, $R_6$, and $R_7$ is the compound represented by formula (4), and $n_1$ is 1; and in which $R_8$ is the group represented by formula (4), and $n_2$ is 12.

In Examples 1 to 9, a mixture of three photosensitive compounds with different mass ratios was used, respectively. See Table 1 for details.

Comparative Example 1

13 g of a phenolic resin, 3 g of the first photosensitive compound described in the Examples, 0.5 g of a surfactant, 1.5 g of an adhesion promoter, and 82 g of a solvent were mixed, to obtain a photoresist composition.

Comparative Example 2

13 g of a phenolic resin, 3 g of the second photosensitive compound described in the Examples, 0.5 g of a surfactant, 1.5 g of an adhesion promoter, and 82 g of a solvent were mixed, to obtain a photoresist composition.

Comparative Example 3

13 g of a phenolic resin, 3 g of the third photosensitive compound described in the Examples, 0.5 g of a surfactant, 1.5 g of an adhesion promoter, and 82 g of a solvent were mixed, to obtain a photoresist composition.

Comparative Example 4

13 g of a phenolic resin, 3 g of the first photosensitive compound and the second photosensitive compound described in the Examples, 0.5 g of a surfactant, 1.5 g of an adhesion promoter, and 82 g of a solvent were mixed, to obtain a photoresist composition. See Table 1 for the mass ratio of the first photosensitive compound and the second photosensitive compound.

Comparative Example 5

13 g of a phenolic resin, 3 g of the first photosensitive compound and the third photosensitive compound described in the Examples, 0.5 g of a surfactant, 1.5 g of an adhesion promoter, and 82 g of a solvent were mixed, to obtain a photoresist composition. See Table 1 for the mass ratio of the first photosensitive compound and the third photosensitive compound.

Comparative Example 6

13 g of a phenolic resin, 3 g of the second photosensitive compound and the third photosensitive compound described in the Examples, 0.5 g of a surfactant, 1.5 g of an adhesion promoter, and 82 g of a solvent were mixed, to obtain a photoresist composition. See Table 1 for the mass ratio of the second photosensitive compound and the third photosensitive compound.

TABLE 1

Compositions of photosensitive compounds in Examples 1 to 9 and Comparative Examples 1 to 6.

| | First photosensitive compound | Second photosensitive compound | Third photosensitive compound |
|---|---|---|---|
| Example 1 | 50 | 40 | 10 |
| Example 2 | 50 | 30 | 20 |
| Example 3 | 50 | 25 | 25 |
| Example 4 | 40 | 50 | 10 |
| Example 5 | 30 | 50 | 20 |
| Example 6 | 25 | 50 | 25 |
| Example 7 | 45 | 25 | 30 |
| Example 8 | 35 | 35 | 30 |
| Example 9 | 30 | 40 | 30 |
| Comparative Example 1 | 100 | 0 | 0 |
| Comparative Example 2 | 0 | 100 | 0 |
| Comparative Example 3 | 0 | 0 | 100 |
| Comparative Example 4 | 50 | 50 | 0 |
| Comparative Example 5 | 50 | 0 | 50 |
| Comparative Example 6 | 0 | 50 | 50 |

The sensitivity, resolution, and residual film rate of the photoresist compositions in the foregoing Examples and Comparative Examples were evaluated. The specific evaluation method is described as below. The photoresist composition of any of the above-mentioned Examples or any of the Comparative Examples is coated on the silicon wafer by slit coating, and after VCD vacuum drying, baked for 90 seconds on a hot plate at a temperature of 110° C., to form a photoresist coating having a coating thickness of about 1.5 µm. Then the masks with patterns having different line width of 1 to 5 µm and the mixed light source of H line, G line and I line were used to expose the photoresist layer with different energy levels. After the exposure, it was developed with 2.38 wt % of tetramethylammonium hydroxide (TMAH) for 1 minute, washed with water for 25 seconds, and then dried to remove the exposed part, to form a photoresist pattern. The thicknesses of the photoresist layer before and after exposure were inspected by a film thickness meter, to evaluate the residual film rate of the photoresist. A scanning electron microscope was used to inspect the photoresist pattern, to compare the sensitivity and resolution of the photoresist. Sensitivity is based on the exposure energy corresponding to the pattern line having 3 µm. The smaller the exposure energy, the better the productivity. The resolution is subject to the minimum line width that can be achieved. The smaller the line width, the higher the resolution. The method for determining the resolution is as follows. The exposure energy corresponding to the line having 3 µm is used to expose the photoresist coating, and then the pattern lines are obtained. The ratio (T/P) of the top width to the bottom width for the obtained pattern lines is calculated. The minimum line width in the used masks is determined as the resolution value when the ratio T/P satisfies to be greater than 60%.

TABLE 2

Test results of Examples 1 to 9 and Comparative Examples 1 to 6.

| | Sensitivity (mj) | Residual film rate (%) | Resolution (µm) |
|---|---|---|---|
| Example 1 | 63 | 99 | 1.5 |
| Example 2 | 53 | 96 | 2.5 |
| Example 3 | 53 | 92 | 2.5 |
| Example 4 | 72 | 99 | 1.5 |
| Example 5 | 70 | 99 | 1.5 |
| Example 6 | 66 | 99 | 2.0 |
| Example 7 | 52 | 90 | 2.7 |
| Example 8 | 57 | 94 | 2.5 |
| Example 9 | 60 | 96 | 2.5 |
| Comparative Example 1 | 50 | 97 | 3.0 |
| Comparative Example 2 | 98 | 99 | 1.5 |
| Comparative Example 3 | X | X | X |
| Comparative Example 4 | 79 | 99 | 1.5 |
| Comparative Example 5 | 33 | 63 | 3.5 |
| Comparative Example 6 | 56 | 89 | 3.0 |

Note:
X means the sensitivity is too fast to detect.

Figure 2:
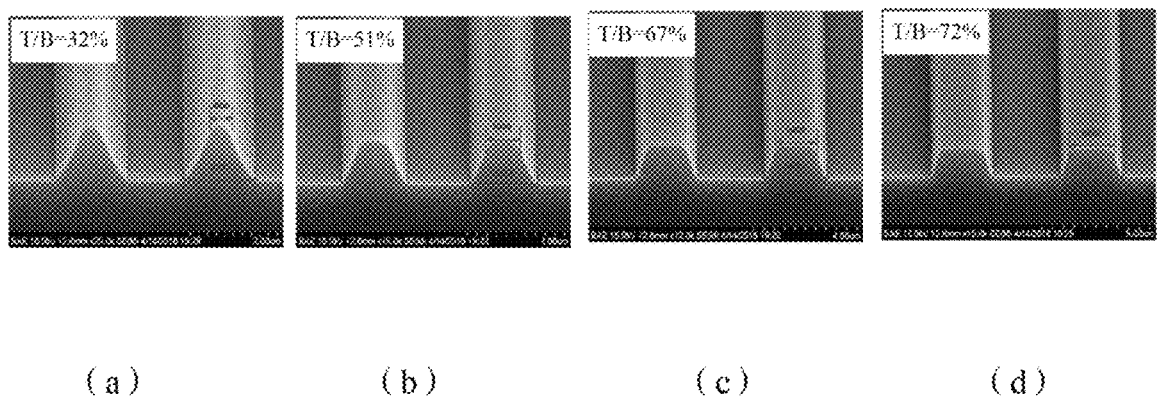
FIG. 2 is a graph of test results showing the resolution of the photoresist composition prepared according to another example of the present disclosure.

Comparing the resolution results of Examples 1 to 3, it can be seen that when three photosensitive compounds are used, the higher the content of the second photosensitive compound, the better the resolution of the pattern; and the higher the content of the third photosensitive compound, the worse the resolution of pattern. FIG. 1 is a graph of test results showing the resolution of the photoresist composition prepared according to the Example 1. FIGS. (a), (b), (c) and (d) are scanning electron microscope images of the photoresist pattern line when masks having different line width of 1.5, 2.0, 2.5 and 3.0 µm are used respectively. It can be seen from FIG. 1 that all of the ratio T/P are greater than 60%. Therefore, the resolution for the photoresist composition in Example 1 is 1.5 µm (FIG. (a)). FIG. 2 is a graph of test results showing the resolution of the photoresist composition prepared according to the Example 2. FIGS. (a), (b), (c) and (d) are scanning electron microscope images of the photoresist pattern line when masks having different line width of 1.5, 2.0, 2.5 and 3.0 µm are used respectively. It can be seen from FIG. 2 that the ratios T/P for only FIGS. (c) and (d) are greater than 60%, and therefore the resolution for the photoresist composition in Example 2 is 2.5 µm (FIG. (c)).

Comparing the test results of Examples 1 to 9, it can be seen that the line width of the photoresist patterns prepared in Example 1, Example 4 and Example 5 can reach 1.5 µm, that is, a high-resolution pattern can be realized; further considering sensitivity and residual film rate, the residual film rate of Example 1, Example 4 and Example 5 can reach 99%, but the sensitivity of Example 1 and Example 5 is faster than that of Example 4, and Example 1 and Example 5 can better meet the requirements of increasing production capacity. Considering comprehensively, Example 1 and Example 5 can simultaneously meet the requirements of high resolution and high sensitivity.

Figure 3:
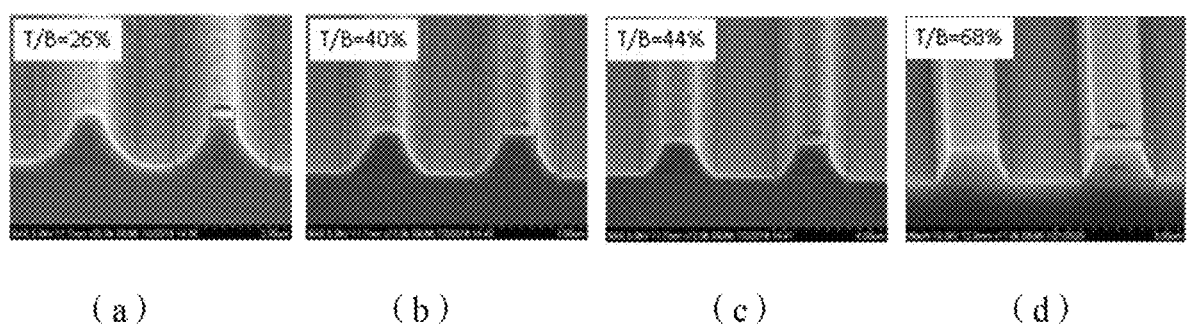
FIG. 3 is a graph of test results showing the resolution of the photoresist composition prepared according to a comparative example of the present disclosure.

In addition, comparing the test results of Comparative Examples 1 to 3, it can be seen that Comparative Example 1 only uses the first photosensitive compound, which has fast sensitivity but low resolution, and a resolution of 3 µm (as shown in FIG. 3); Comparative Example 2 only uses the second photosensitive compound, which has high resolution but too slow sensitivity, and is about twice that of Comparative Example 1; and Comparative Example 3 only uses the third photosensitive compound, which has too fast sensitivity and cannot be used alone. FIG. 3 is a graph of test results showing the resolution of the photoresist composition prepared according to the Compare Example 1. FIGS. (a), (b), (c) and (d) are scanning electron microscope images of the photoresist pattern line when masks having different line width of 1.5, 2.0, 2.5 and 3.0 μm are used respectively. It can be seen from FIG. 3 that the ratio T/P for only FIG. (d) is greater than 60%, and therefore the resolution for the photoresist composition in Compare Example 1 is 3.0 μm (FIG. (d)).

Further, as can be seen from the test results of Comparative Examples 4 to 6, Comparative Example 4 uses the first photosensitive compound and the second photosensitive compound at the same time and can achieve a resolution of 1.5 μm, but the sensitivity is still slow; Comparative Example 5 uses the first photosensitive compound and the third photosensitive compound at the same time, and has very fast sensitivity, but has low residual film rate and poor resolution; and Comparative Example 6 uses the second photosensitive compound and the third photosensitive compound at the same time, and can achieve high sensitivity, but the resolution was not ideal. As can be seen from the above test results, when the content of the third photosensitive compound is relatively high, the residual film rate and resolution are unfavorable, so the amount of the third photosensitive compound must be strictly controlled.

In summary, the photoresist in the present disclosure can meet the requirements of high resolution, high sensitivity, and high residual film rate, thereby increasing the yield of the OLED flat panel display in manufacturing industry.

The above description of the disclosed Examples allows one skilled in the art to implement or use the technical solutions of the present disclosure. The description of the above Examples is merely used for helping to understand the inventive concepts and technical solutions of the present disclosure. It should be noted that a person skilled in the art may make further improvements and modifications to the disclosure without departing from the principle/spirit of the present disclosure, and these improvements and modifications shall also fall within the scope of the present disclosure. Therefore, the present disclosure will not be limited to the Examples shown herein, but should conform to the widest scope consistent with the principles and novel features disclosed herein.

What is claimed is:

1. A photoresist composition, comprising: 1 wt % to 10 wt % of a photosensitizer; 10 wt % to 20 wt % of a phenolic resin; 0.1 wt % to 5.5 wt % of an additive; and 75 wt % to 88 wt % of a solvent, based on the total weight of the photoresist composition,
wherein the photosensitizer comprises: 30 wt % to 50 wt % of a first photosensitive compound represented by formula (1); 40 wt % to 50 wt % of a second photosensitive compound represented by formula (2); and 10 wt % to 25 wt % of a third photosensitive compound represented by formula (3), based on the total weight of the photosensitizer,

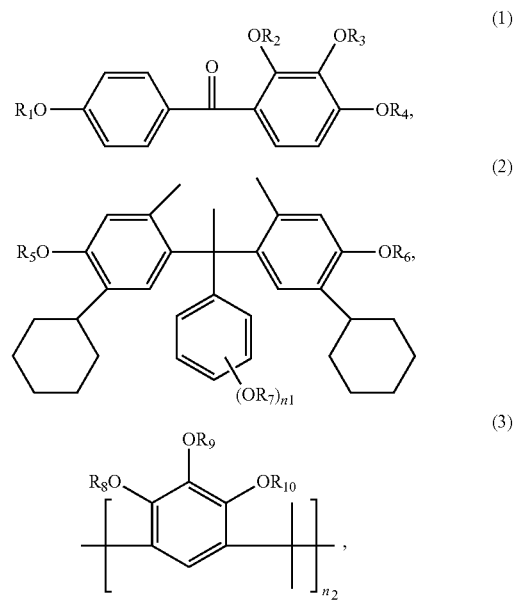

wherein $R_1$, $R_2$, $R_3$ and $R_4$ are each independently selected from a group represented by a formula (4), a group represented by the formula (5), or hydrogen atom, and at least three of $R_1$, $R_2$, $R_3$ and $R_4$ are the group represented by formula (4) or formula (5);

wherein $R_5$, $R_6$ and $R_7$ are each independently selected from the group represented by formula (4), the group represented by formula (5), or hydrogen atom, and at least one of $R_5$, $R_6$ and $R_7$ is the group represented by formula (4) or formula (5), and $n_1$ is 1 or 2;

wherein $R_8$, $R_9$ and $R_{10}$ are each independently selected from the group represented by formula (4), the group represented by formula (5), or hydrogen atom, and at most one of $R_8$, $R_9$ and $R_{10}$ is the group represented by formula (4) or formula (5), the rest is hydrogen atom, and $n_2$ is an integer of 5 to 50;

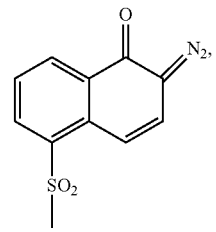

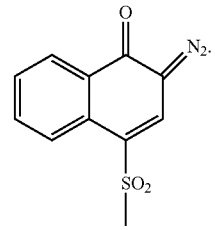

2. The photoresist composition of claim 1, wherein in the compound represented by formula (3), $n_2$ is an integer of 10 to 25.

3. The photoresist composition of claim 1, wherein a mass ratio of the first photosensitive compound to the second photosensitive compound is in a range from 3:7 to 7:3.

4. The photoresist composition of claim 1, wherein a mass ratio of the second photosensitive compound to the third photosensitive compound is greater than 1:1.

5. The photoresist composition of claim 1, wherein the additive comprises a surfactant and an adhesion promoter.

6. The photoresist composition of claim 5, wherein an amount of the surfactant is in a range from 0.1 wt % to 0.5 wt %; and an amount of the adhesion promoter is in a range from 1 wt % to 5 wt %.

7. The photoresist composition of claim 5, wherein the surfactant is a silicone-based surfactant or a fluorocarbon compound; and the adhesion promoter is one or more selected from a group consisting of melamine resin, silane coupling agent and polyethylene based compound.

8. The photoresist composition of claim 1, wherein the phenolic resin has a molecular weight in a range from 4000 to 8000.

9. A method for preparing a photoresist composition, comprising:
mixing uniformly 1 wt % to 10 wt % of a photosensitizer, 10 wt % to 20 wt % of a phenolic resin, 0.1 wt % to 5.5 wt % of an additive, 75 wt % to 88 wt % of a solvent, based on the total weight of the photoresist composition, and dissolving the photosensitizer, the phenolic resin and the additive into the solvent to obtain the photoresist composition,
wherein the photosensitizer comprises: 30 wt % to 50 wt % of a first photosensitive compound represented by formula (1), 40 wt % to 50 wt % of a second photosensitive compound represented by formula (2), and 10 wt % to 25 wt % of a third photosensitive compound represented by formula (3), based on the total weight of the photosensitizer,

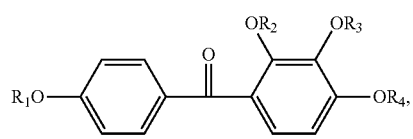
(1)

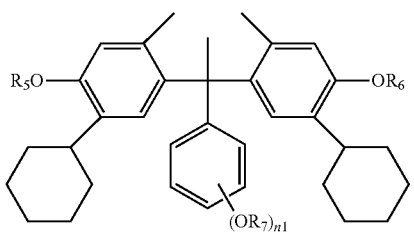
(2)

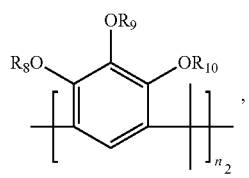
(3)

wherein $R_1$, $R_2$, $R_3$ and $R_4$ are each independently selected from the group represented by a formula (4), a group represented by the formula (5), or hydrogen atom, and at least three of $R_1$, $R_2$, $R_3$ and $R_4$ are the group represented by formula (4) or formula (5);

wherein $R_5$, $R_6$ and $R_7$ are each independently selected from the group represented by formula (4), the group represented by formula (5), or hydrogen atom, and at least one of $R_5$, $R_6$ and $R_7$ is the group represented by formula (4) or formula (5), and $n_1$ is 1 or 2;

wherein $R_8$, $R_9$ and $R_{10}$ are each independently selected from the group represented by formula (4), the group represented by formula (5), or hydrogen atom, and at most one of $R_8$, $R_9$ and $R_{10}$ is the group represented by formula (4) or formula (5), the rest is hydrogen atom, and $n_2$ is an integer of 5 to 50;

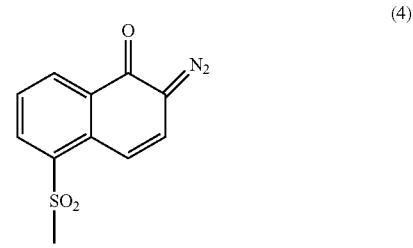
(4)

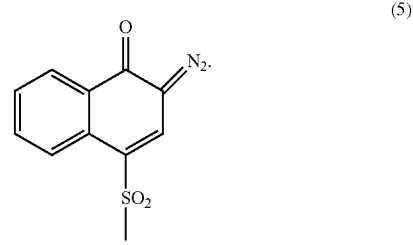
(5)

10. The method of claim 9, wherein in the compound represented by formula (3), $n_2$ is an integer of 10 to 25.

11. The method of claim 9, wherein a mass ratio of the first photosensitive compound to the second photosensitive compound is in a range from 3:7 to 7:3.

12. The method of claim 9, wherein a mass ratio of the second photosensitive compound to the third photosensitive compound is greater than 1:1.

13. The method of claim 9, wherein the additive comprises a surfactant and an adhesion promoter.

14. The method of claim 13, wherein an amount of the surfactant is in a range from 0.1 wt % to 0.5 wt %; and the amount of the adhesion promoter is in a range from 1 wt % to 5 wt %.

15. The method of claim 13, wherein the surfactant is a silicone-based surfactant or a fluorocarbon compound; and the adhesion promoter is one or more selected from a group consisting of melamine resin, silane coupling agent and polyethylene based compound.

16. The method of claim 9, wherein the phenolic resin has a molecular weight in a range from 4000 to 8000.

17. A patterning method using the photoresist composition of claim 1, comprising:
providing a base substrate;
forming a functional material layer on the base substrate;
coating the photoresist composition on the functional material layer to form a photoresist layer;
exposing the photoresist layer to a mixed light source of H line, I line and G line through a mask;
developing the exposed photoresist layer to form a photoresist pattern; and
etching the functional material layer by using the photoresist pattern as a mask, to form a functional pattern.

18. The photoresist composition of claim 1, wherein the photosensitizer comprises: 30 wt % to 50 wt % of the first photosensitive compound; 40 wt % to 50 wt % of the second photosensitive compound; and 10 wt % to 18 wt % of the third photosensitive compound, based on the total weight of the photosensitizer.

19. The method of claim 9, wherein the photosensitizer comprises: 30 wt % to 50 wt % of the first photosensitive compound; 40 wt % to 50 wt % of the second photosensitive compound; and 10 wt % to 18 wt % of the third photosensitive compound, based on the total weight of the photosensitizer.

20. The patterning method of claim 17, wherein the photosensitizer comprises: 30 wt % to 50 wt % of the first photosensitive compound; 40 wt % to 50 wt % of the second photosensitive compound; and 10 wt % to 18 wt % of the third photosensitive compound, based on the total weight of the photosensitizer.

\* \* \* \* \*